United States Patent [19]

Pickles et al.

[11] Patent Number: 5,051,099
[45] Date of Patent: * Sep. 24, 1991

[54] HIGH SPEED CARD EDGE CONNECTOR

[75] Inventors: Charles S. Pickles, Hummelstown; Matthew M. Sucheski, Harrisburg, both of Pa.

[73] Assignee: AMP Incorporated, Harrisburg, Pa.

[*] Notice: The portion of the term of this patent subsequent to Jun. 25, 2008 has been disclaimed.

[21] Appl. No.: 593,186

[22] Filed: Oct. 5, 1990

Related U.S. Application Data

[63] Continuation-in-part of Ser. No. 458,071, Jan. 10, 1990.

[51] Int. Cl.$^5$ .............................................. H01R 4/66
[52] U.S. Cl. ..................................... 439/108; 439/636
[58] Field of Search ...................... 439/59, 62, 65, 79, 439/92, 101, 108, 636, 637, 924

[56] References Cited

U.S. PATENT DOCUMENTS

| | | | |
|---|---|---|---|
| 3,399,372 | 8/1968 | Uberbacher | 439/60 |
| 3,744,005 | 7/1973 | Sitzler | 439/637 |
| 4,659,155 | 4/1987 | Walkup et al. | 439/108 |
| 4,806,103 | 2/1989 | Kniese et al. | 439/636 |
| 4,806,110 | 2/1989 | Lindeman | 439/108 |
| 4,824,384 | 4/1989 | Nicholas et al. | 439/108 |
| 4,992,052 | 2/1991 | Verhoeven | 439/62 |

FOREIGN PATENT DOCUMENTS

| | | | |
|---|---|---|---|
| 1170256 | 11/1969 | United Kingdom | 439/637 |
| 1400605 | 7/1975 | United Kingdom | 439/92 |

OTHER PUBLICATIONS

IBM Technical Disclosure Bulletin, "Ground Plane Interposer", vol. 21, No. 3, Aug. 1978, p. 955.

Primary Examiner—Gary F. Paumen
Attorney, Agent, or Firm—Katherine A. Nelson

[57] ABSTRACT

A card edge electrical connector 10 includes a dielectric housing member 12, a card receiving cavity 30, a plurality of contacts including signal contact members 35,35a arranged in opposed pairs along opposite sides of the card receiving cavity 30 and ground contact member 54 associated with each pair of signal contact members 35,35a. Each signal contact member 35,35a has a first contact surface 43 for engaging corresponding signal traces 184 on the daughter card 172 and second contact sections 52,52a respectively exposed along the mounting face 18 of the housing 12 and adapted to be engaged to corresponding signal contact means 92 of another electrical article 86. A ground contact member 53 is mounted into the housing 12 at each contact location and includes first ground contact sections 62 engageable with ground contact means 180 of card 172 upon full card insertion, the first ground contact sections 62 being spaced both vertically and horizontally from the associated first signal contact surfaces 43. The ground contact member 53 further includes second ground contact sections 70 exposed along the mounting face 18 of the housing 12 and engageable with corresponding ground contacts 96 of the electrical article 86.

3 Claims, 5 Drawing Sheets

HIGH SPEED CARD EDGE CONNECTOR

RELATED APPLICATIONS

This application is a continuation-in-part of U.S. patent application Ser. No. 07/458,071, filed Jan. 10, 1990.

FIELD OF THE INVENTION

The present invention is related to card edge connectors and more particularly to high-speed card edge connectors.

BACKGROUND OF THE INVENTION

The needs of today's electronic industry require higher speed electronic equipment such as computers and the like. Since many of the electrical interconnections within this type of equipment use circuit boards, it is desirable to provide high-speed card edge connectors having a controlled impedance that will essentially match the impedance of the circuit boards. A high-speed connector is one that can pass fast rise time signals without distorting or degrading that rise time. It is desirable, therefore, to control the impedance of the connector to reduce signal reflection caused by changes in impedance in the pathways conducting the digital pulse. Impedance control includes controlled spacing of ground and signal traces and interconnections. With the closer spacing of the conductors, it is also necessary to prevent cross talk between adjacent conductors.

U.S. patent application Ser. No. 07/458,071 discloses a card edge connector for use with a circuit card of the type having ground contact means disposed along a leading edge of the card and signal traces having contact means located rearwardly from the ground contact means. The connector includes a housing member having a plurality of contact receiving passageways including contact locations spaced laterally along a card receiving cavity. Each passageway has a pair of opposed signal contact members and a discrete ground contact member disposed therein, the ground contact member being positioned between the pair of signal contact members. Owing to the position of the ground and signal contact means on the circuit card and the corresponding contact sections of the signal and ground contact surfaces, the contact surfaces of the signal contact members temporarily engage the ground contact means of the card during insertion of the circuit card into the connector. Thus it is important that an electrical system not be energized during the insertion or withdrawal of the daughter card from the connector. It is desirable, therefore, to have a connector having the same desired electrical characteristics that permits insertion and/or withdrawal of daughter cards while the electronic system remains energized.

U.S. Pat. No. 4,659,155 discloses a two-piece daughter board-backplane connector having an internal connector for use with a circuit board having an internal ground plane layer. The daughter board element is connected to a multilayer impedance controlled daughter board having internal ground layers and signal conductors on opposed surfaces. The signal contacts on the board are electrically engaged with rows of signal contacts disposed on opposite sides of the daughter board. The ground contacts are mounted between dielectric portion of the connector element and overlap a plurality of signal contacts on a backplane connector element. The ground contacts overlap a plurality of adjacent signal contacts. The daughter board connector includes a plurality of receptacles for receiving pin members on the backplane element. One disadvantage of the above connector is that it is a two-piece assembly that requires a considerable amount of space to accommodate all of the components of the assembly. Furthermore the connector has a number of different parts, which require a number of manufacturing steps to produce the assembly, thereby increasing the cost of the finished product. It is desirable, therefore, to provide a means for assuring a ground contact closely associated with signal connections in a compact and cost effective one-piece connector.

U.S. Pat. No. 3,399,372 discloses a high density connector package having a plurality of signal and ground contacts arranged in an alternating array such that each signal contact is associated with a ground contact. In the disclosed embodiment, the signal contacts are small wire members and the ground contacts are metal sheet members thereby providing for close stacking of the signal and ground pairs. The disadvantage of the alternating contact type of system is that for signal contacts to be maintained at a given center line spacing, the dimensions of the various internal members of the assembly must be "scaled down" to provide for "double density", that is that two adjacent contacts must be accommodated in the space previously occupied by a single contact member.

SUMMARY OF THE INVENTION

Accordingly, the present invention is directed to an electrical connector that alleviates the disadvantages and deficiencies of the prior art by providing a means for assuring a ground connection associated with each signal connection at each location of a pair of signal contacts and between the signal contact members of each pair and concomitantly maintains the electrical integrity of an energized electronic system during withdrawal and/or insertion of daughter cards therefrom.

The electrical connector of the present invention is designed for use with circuit boards of the type having ground contact means disposed along the leading edge thereof and signal traces disposed proximate to and spaced vertically and horizontally from the ground contact means. The connector comprises a dielectric housing member having a plurality of contact locations spaced laterally along a card receiving cavity extending therein, a pair of opposed signal contact members and a discrete ground contact member disposed between the opposed contact members at each contact location of the connector. The signal contact members have contact sections for engaging respective opposed traces on opposite major surfaces of a card inserted therebetween, the contact sections being defined on raised portions of the free ends of cantilevered beams, which extend into the cavity and are deflected outwardly by the card upon card insertion therebetween. The signal contacts are configured so that the respective contact sections are proximate a first side of the respective contact receiving passageway. Upon full insertion of the card the contact sections become engaged with the respective signal contact sections on the circuit board. At each contact location a ground contact member having a first contact section comprising a pair of opposed cantilevered beams also extends into the card receiving cavity. The beams include contact sections thereon engageable with the ground contact means on opposed sides of the card upon full insertion therebetween. The ground contact beams are configured so that the corresponding contact sections lie proximate a second side of the respective contact receiving passageway, thereby spacing the respective contact sections of the associated signal and ground contact members vertically as well as horizontally from each other within each passageway. The card edge connector of the present invention provides an assured ground connection associated with each signal connection and at each location of the signal contact pairs and permits insertion and or withdrawal of a daughter card from an energized electronic system.

It is an object of the invention to provide a one-piece grounded high-speed connector.

It is also an object of the invention to provide a high-speed connector that can remain energized during insertion or withdrawal of a circuit card therefrom.

It is another object of the invention to provide a high-speed connector that will fit within the same geometric spacing as existing card edge connectors while maintaining the same number of signal contacts on the same centerlines as standard card edge connectors.

It is a further object of the invention to provide a one-piece controlled impedance card edge connector.

It is also an object of the invention to provide a cost effective means for making a one-piece high-speed electrical connector.

It is a still further object of the present invention to provide a signal and ground pair at each contact position.

It is an additional object of the invention to provide a short electrical ground or reference path between the daughter board and the mother board or backplane.

Some of the objects and advantages of the invention having been stated, others will appear as the description proceeds when taken in connection with the accompanying drawing.

DETAILED DESCRIPTION OF THE DRAWING

Figure 1:
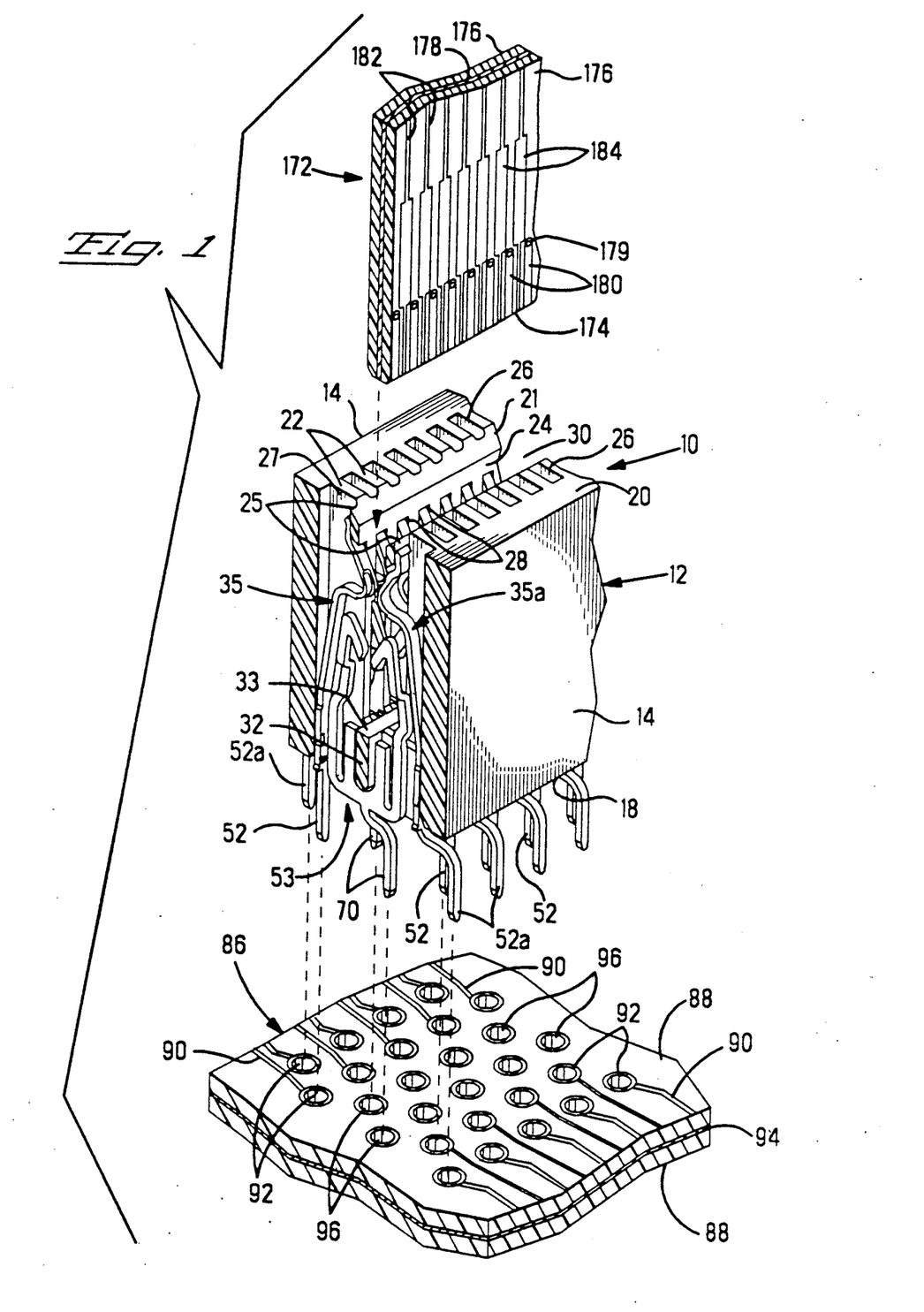
FIG. 1 is an exploded fragmentary perspective view of the connector of the invention mating a daughter board and a backplane.

FIG. 1 shows an electrical connector 10 comprising a dielectric housing member 12 having opposed arrays of contact receiving passageways 26 extending therethrough, a plurality of contact members 35,35a,53 disposed in respective passageways 26 and a card receiving cavity 30 extending laterally between the opposed arrays of passageways 26 for receiving a card member 172. Dielectric housing member 12 has opposed side walls 14, end walls (not shown), mounting face 18 and card receiving face 20 having lead-in 21. An array of contact receiving passageways 26 is defined along side walls 14 of housing 12 for receiving respective signal contact members 35,35a and ground contact members 53 therein. Adjacent contact receiving passageways 26 in respective arrays are separated by internal wall portions 22, the inner edges 24 of which define card receiving cavity 30. Respective arrays of signal contact locations 28 extend along the upper part of card receiving cavity 30, a signal location 28 being associated with each one of the contact receiving passageways 26. Housing 12 further includes a lower web or wall 32 extending longitudinally between opposed end walls (not shown), the upper surface 33 of wall 32 defining the lower end of card receiving cavity 30.

Figures 2, 3, 4:
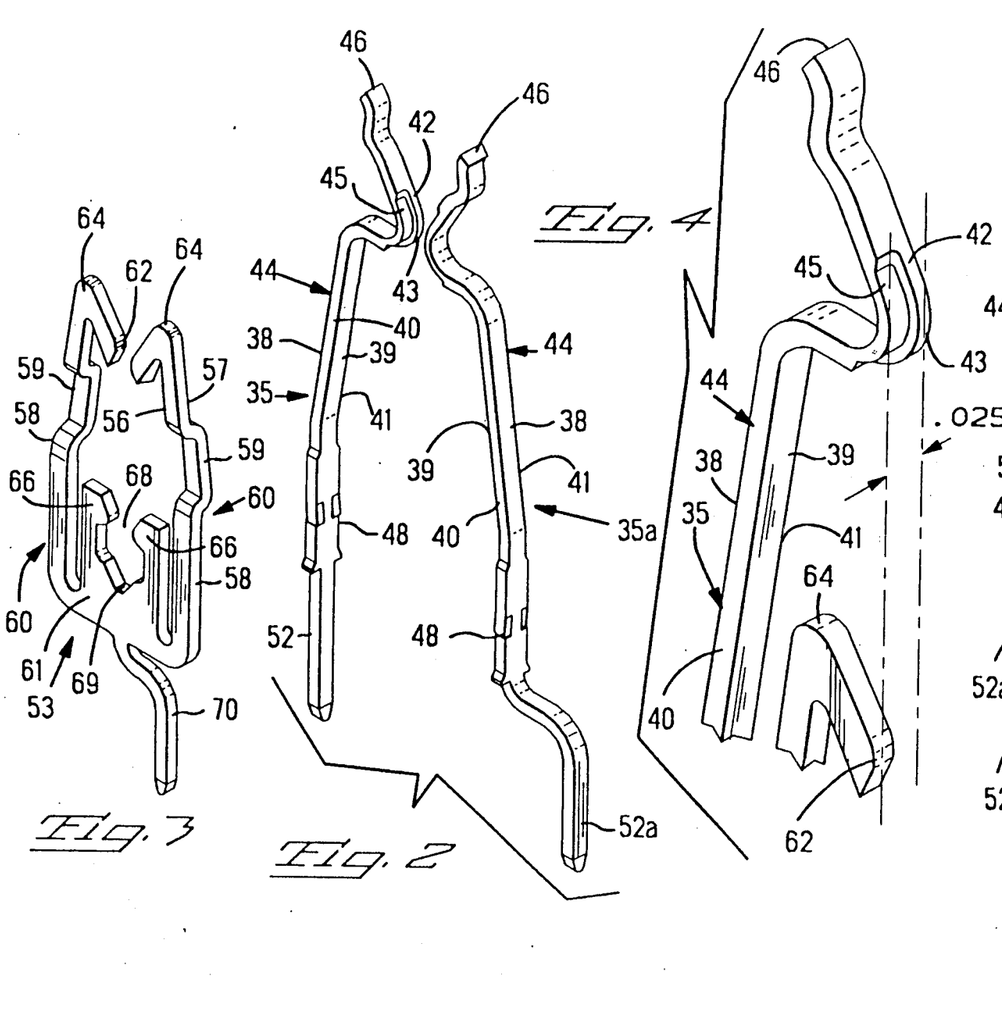
FIG. 2 is a perspective view of a pair of signal contact members made in accordance with the invention.
FIG. 3 is a perspective view of the ground contact member made in accordance with the invention.
FIG. 4 is a fragmentary enlarged view of the signal and ground contact members illustrating the offset contact surfaces.
Figure 6:
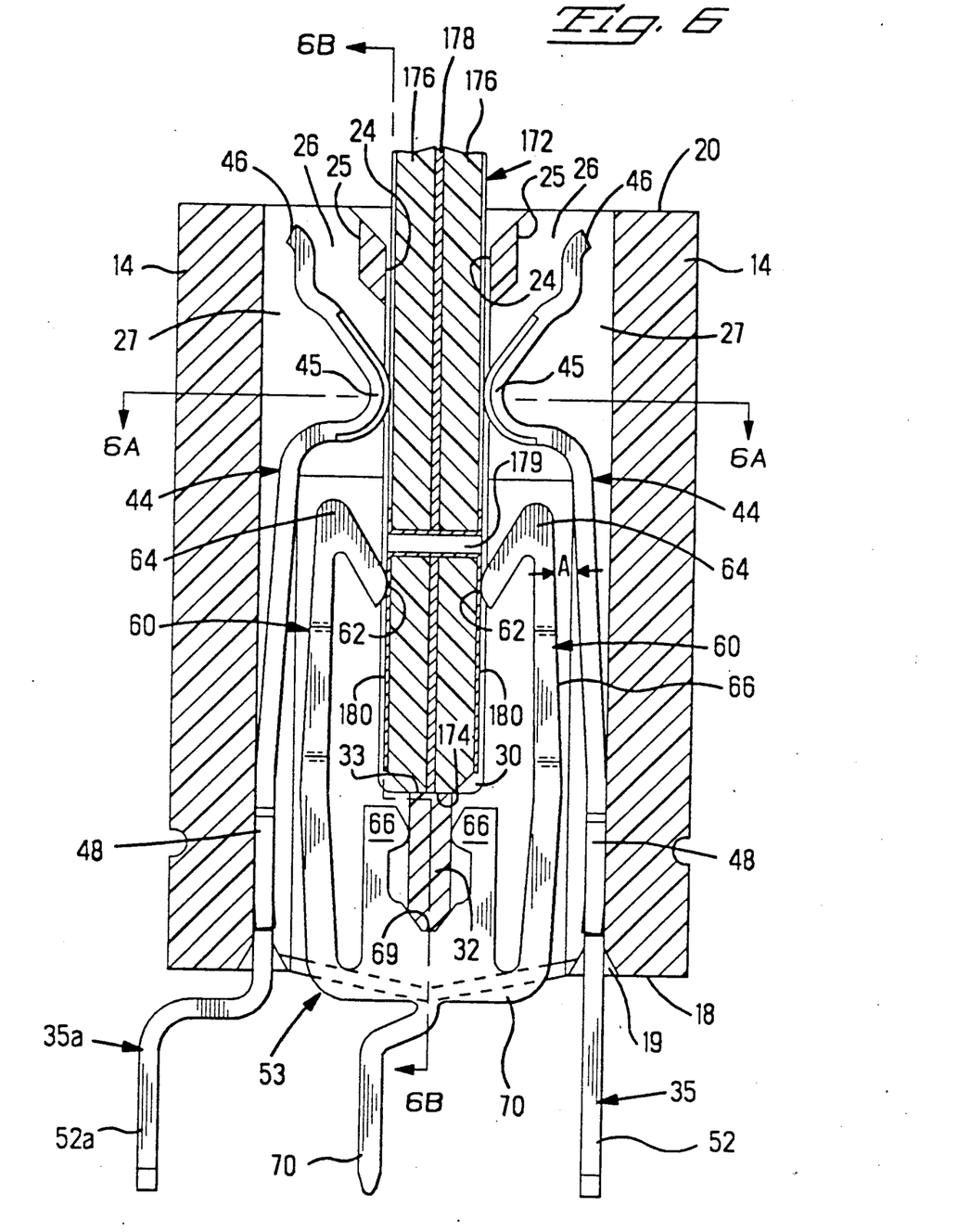
FIG. 6 is a cross-sectional view of the connector of FIG. 1 illustrating the contact members after full insertion of the daughter card between the signal and ground contact members of the present invention.
Figure 6A:
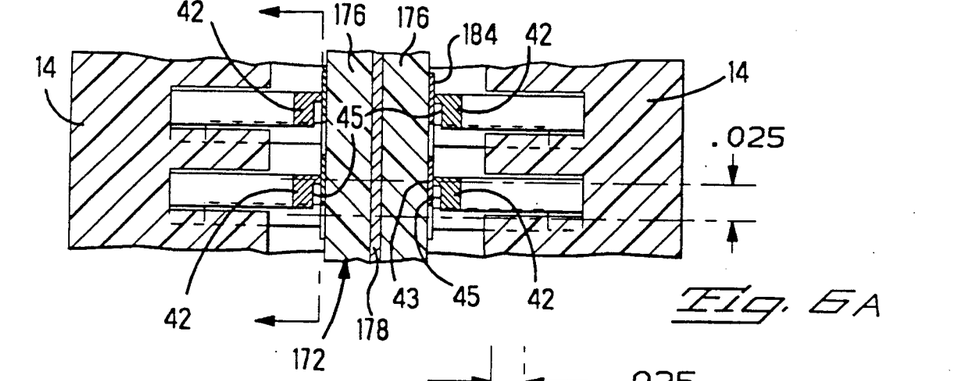
FIGS. 6A and 6B are views taken along the lines 6A—6A, 6B—6B, respectively of FIG. 6.

As shown in FIG. 1 and 6 a pair of opposed signal contact members 35,35a and a single ground contact 53 are disposed within each of the contact receiving cavities 26. As best seen in FIG. 2, in the preferred embodiment, the opposed pair of signal contact members 35,35a are stamped and formed members having opposed major surfaces 38,39 and opposed side edges 40,41. Each signal contact member 35,35a includes first and second signal contact section 44 comprises a cantilevered beam having a configured portion 42 adjacent the free end 46 thereof. As can best be seen in FIGS. 2 and 4, portion 42 includes a portion 45 having a reduced thickness and portion 43 being substantially the thickness of the stamped member. Since portion 43 is thicker than portion 45, only the surface of 43 will engage the surface of the daughter card thereby defining a respective signal contact surface for engaging a corresponding signal contact 184 on a circuit card 172, as shown in FIG. 6A. As can be seen from FIGS. 2 and 4, the width of portion 43 is approximately one quarter that of the configured portion 45. It is to be understood that the relative width of portions 43 and 45 may be varied to accommodate the geometry of the circuitry on the card. The second contact sections 52 and 52a of signal contact members 35,35a extend from respective other ends thereof and through the mounting face 18 of the housing 12. For purposes of illustration, the surrounding portions of housing 12 have been eliminated from FIGS. 2 through 5 and the pair of spring contact members 35,35a are shown in the same prestressed position as the contact members 35,35a of FIG. 1.

Figure 5:
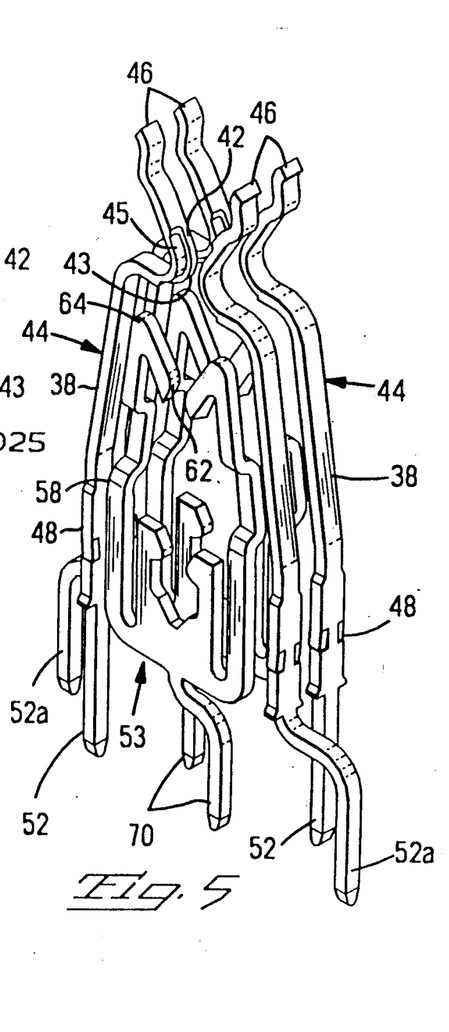
FIG. 5 is a perspective view of two sets of signal and ground contact members removed from the connector housing and illustrating the relative positions of the contact members in adjacent contact receiving passageways.

As shown in these Figures, the two styles of signal contact members 35,35a differ only in the shape of the second contact sections 52,52a and are arranged alternately in the respective cavities 26 of housing 12. As best seen in FIG. 1, this arrangement provides a staggered array of second contact sections 52,52a extending from mounting face 18 for electrically engaging a corresponding staggered array of signal through-holes 92 in backplane 86. The two arrays are best seen in FIG. 5, which illustrates the relative positions of signal and ground contact members from two adjacent contact receiving passageways. Signal contact members 35,35a further include outwardly extending locking means 48 which are adapted to cooperate with wall portions (not shown) within the housing 12 to secure the signal contact members 35,35a therein. As shown in FIGS. 1 and 6, the free ends 46 of opposed contact beams 44 lie adjacent surface 25 of wall 22 forming the contact receiving card receiving cavity 30 and are held in a pre-stressed position thereagainst.

Figure 6B:
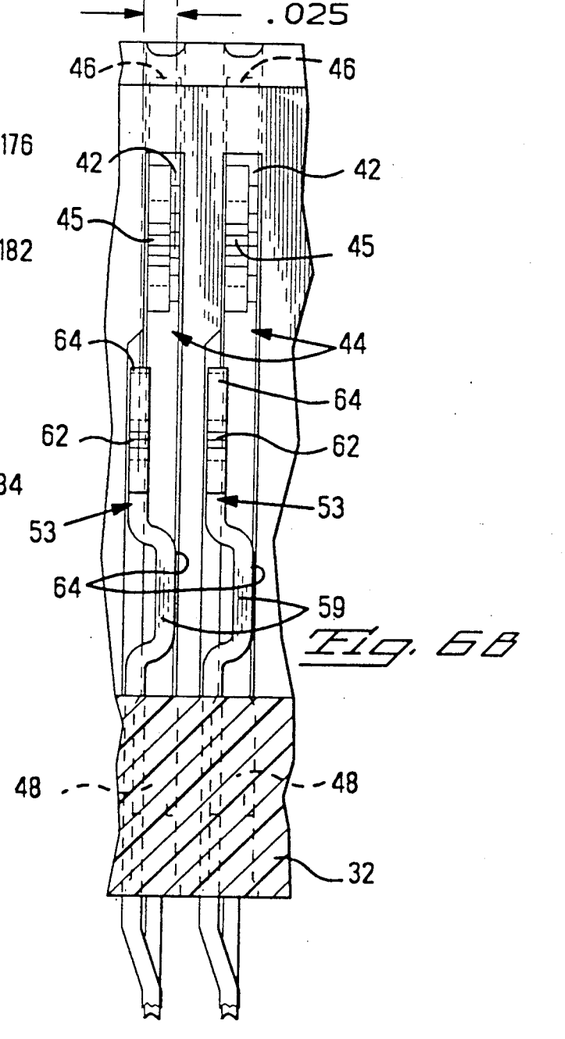

As best seen in FIG. 3, ground contact member 53 is generally a U-shaped member having opposed major surfaces 56,57, edges 58 and cantilevered beams 60 extending upwardly from bight section 61. Cantilevered beams 60 have first contact sections 62 at opposed free ends 64 thereof. In the preferred embodiment, beams 60 include a formed portion 59 that extends outwardly of the plane of the body and defines a positioning means to keep the contact section 62 proximate the desired sidewall surface 27 of passageway 26, as shown in FIG. 1 and to prevent the ground contact member 53 from "skating" between the surfaces 27 of two adjacent sidewalls 22. As shown in FIG. 4, the width of ground contact section 62 is essentially one half that of the associated signal contact member 35 and lies proximate side edge 40 of contact member 35. The respective contact surfaces 43, 62 of the signal and ground contact members 35,53 are thereby spaced horizontally as well as vertically within the respective passageway 26 of housing 12. Ground contact member 53 further includes a pair of projections 66 extending upwardly from bight section 61 and defining slot 68 having lower surface 69 therebetween. When ground contact member 53 is received in the housing 12 as shown in FIGS. 1 and 6, internal wall 32 is received within slot 68 thereby holding ground contact member 53 within housing 12 and surface 58 along portion 59 proximate the surface 27 of an internal wall 22, as best seen in FIG. 6B.

The horizontally and vertically staggered contact surfaces 43,62 of contact members 35,53 respectively and the configuration of the contact surfaces 180,184 on the circuit card 172 thus enables a circuit card to be inserted in connector 10 without the signal contact surface 43 engaging the ground contact 180, thereby permitting insertion and withdrawal of a card while the connector 10 remains energized. In FIGS. 6, 6A and 6B, contact surfaces 62 of ground contact member 53 are shown in electrical engagement with corresponding ground contact surfaces 180 of card 172. The associated signal contact surfaces 43 are shown in the background and are more clearly seen by referring to FIGS. 6A and 6B which are views taken along the lines 6A—6A, 6B—6B respectively of FIG. 6, looking down and looking across on the contact receiving passageways 22 with the contact members 35,35a,53 and card 172 therein. As can be seen in FIG. 6A, signal contact surface 43 is in electrical engagement with corresponding signal contact surfaces 184 on card 172. FIG. 6B shows the rear surfaces 57 of ground contacts 53 against wall 27 of the respective passageways 22.

The arrangement of the signal contact pair and ground contact member in the same contact receiving passageway more typically occupied only by a signal contact pair, enables the centerline spacing of the signal contact members to be maintained while achieving the advantages of the signal-ground contact combination. These advantages are achieved without the need to provide extra contact receiving passageways or affecting the mechanical tolerances within the housing member, as required in those connectors having additional passageways in "scaled-down" contact members. For example, in a high-speed card connector made in accordance with the present invention signal contact pairs and a ground contact member on a 0.050 inch centerline spacing will occupy the same geometric space as an existing 0.050 inch centerline card edge connector. The contact arrangement of the present invention also facilitates the making of high-speed connectors having signal and contact members on other centerline spacing such as 0.025 and smaller.

In the embodiment shown in FIG. 3, second contact section 70 of ground contact member 53 extends from bight section 61 and is offset from the center thereof. As is seen in FIGS. 1, 5 and 6 ground contact member 53 is placed in housing 12 in one of two positions such that the edge 58 of the ground contact member 53 nearer the second contact section 70 is adjacent signal contact member 35a. The ground contact member 53, therefore, is also reversed in adjacent cavities 26 as best seen in FIGS. 1 and 5 to provide a staggered array of second ground contact sections 70 for insertion into a staggered array of ground through-holes 96 on back plane or mother board 86. For purposes of illustrating the invention, the second contact sections 52,52a of the signal contact members 35,35a and ground contact member 53 are shown as pin members that are received into corresponding signal and ground through-holes 92,96, respectively of a backplane member 86. It is to be understood that the configuration of the second contact section of the respective contact members may have other configurations such as for example socket contacts for receiving pin members.

Figure 7:
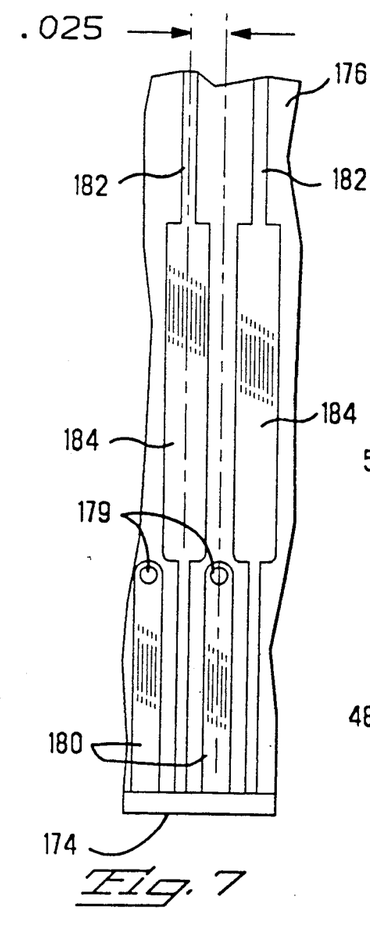
FIG. 7 is an enlarged fragmentary view of one surface of the daughter card illustrating the configuration of the circuity on the card.

Electrical connector 10 is designed for use with a daughter card 172 of the type having ground contact means 180 disposed on opposed major surfaces 176 of card 172 and along a leading edge 174 thereof and proximate thereto and signal traces 182 having signal contact means 184 spaced both vertically and horizontally from the ground contact means 180 on opposed major surfaces 176, as shown in FIGS. 1 and 7. In high-speed electrical applications, it is desirable to establish and maintain electrically stable reference or ground potential through the system including through the daughter card, connector and the mother board or back plane. In the embodiment shown in FIG. 1, card 172 includes a single ground plane layer 178 disposed between dielectric layers and back plane 86 includes ground plane 94 disposed between dielectric layers. A single ground plane layer has been shown for purposes of illustration only. It is to be understood that both the card and back plane may include a plurality of dielectric and ground plane layers. FIG. 6 shows a plated through hole 179 interconnecting the ground plane 178 to ground contact means 180 of the surface of card 172.

In making the electrical connector 10 in accordance with the invention, housing 12 is formed from a dielectric material such as for example polyphenylene sulfide, which is readily available from a number of commercial sources. Other suitable materials, as known in the art, may also be used. The signal contact members are stamped and formed to have a preloaded spring rate designed to provide the desired normal force at the respective contact surface when the card 172 is fully engaged in the connector 10. The signal contact members 35,35a are loaded from the mounting face 18 of the housing 12 and are inserted so that free ends 46 are secured against upper wall portions 28. The outwardly extending flanges 48 of the intermediate portion engage a corresponding flange receiving surface (not shown) within the housing to lock the signal contact members 35,35a within the housing. To facilitate insertion of contact members, mounting face 18 includes lead in surfaces 19. The ground contact member 53 is also inserted from the mounting face 18 of the connector 10 such that the upwardly extending projections 66 are received on opposite sidewalls of lower wall 32. In the preferred embodiment projections 66 define slot 68 having lower surface 69 configured to engage lower housing wall 32 to provide a secure fit within the housing 12. Since the signal contact members 35,35a press against the outside walls 14 of housing 12 and the ground contact member presses against and grips the center wall or web 32, the resultant reactive stresses created in the contact retention region are directed in lines that extend across the connector width, are independent and are not additive. The connector of the present invention, therefore, distributes internal stresses in a optimal manner.

Signal contact members 35, 35a are preferably made from phosphor bronze or other materials having the desired spring characteristics to provide the sufficient normal force. The ground contact member 53 is stamped from a metal having sufficient spring characteristics to provide a desired normal force at the contact mating face thereof, such as phosphor bronze. In accordance with the invention the materials selected and the geometric configuration of the contact members needs to be such that a sufficient normal force is generated at the respective contact areas to assure electrical reliability of the interconnections. Since no preload is formed in the ground contact member, the ground contact member preferably has a higher spring rate than that of the signal terminal member. In the preferred embodiment the geometrical shape of the outside edge 58 of each ground contact beam 60 is substantially the same as the shape of the adjacent internal major surface 39 of the associated beam 44 of a respective signal contact member 35,35a to provide a substantially constant spacing "A" of a selected distance between the signal and ground contact beams and extending essentially along the entire length of the ground contact beams 60. The shape and spacing between the respective members contributes to a characteristic impedance to each signal and ground contact group. By maintaining the same characteristic impedance at all contact locations throughout the connector the characteristic impedance of the connector as a whole may be controlled. The connector, therefore, can be "custom designed" within a range of tolerances to control the impedance and to substantially match the impedance of the daughter card and mother board.

Figure 8:
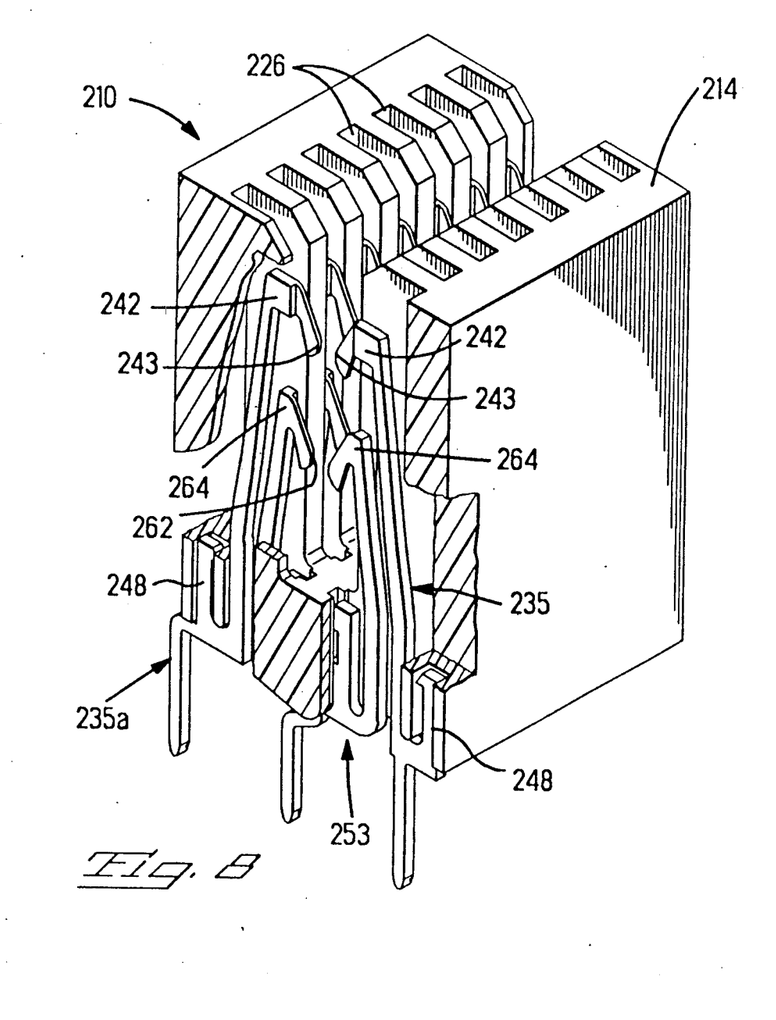
FIG. 8 is a perspective view of an alternative embodiment for the ground contact member.

FIG. 8 illustrates an alternative embodiment 210 of the connector in which the signal and ground contact members 235,253 are essentially planar members that have been "blanked" from a desired material and have skived contact surfaces 243,262, respectively. The upper portions 242,264 of the respective cantilevered beams are positioned so that the respective contact surfaces are offset from each other in the contact receiving passageway 226.

Figure 9:
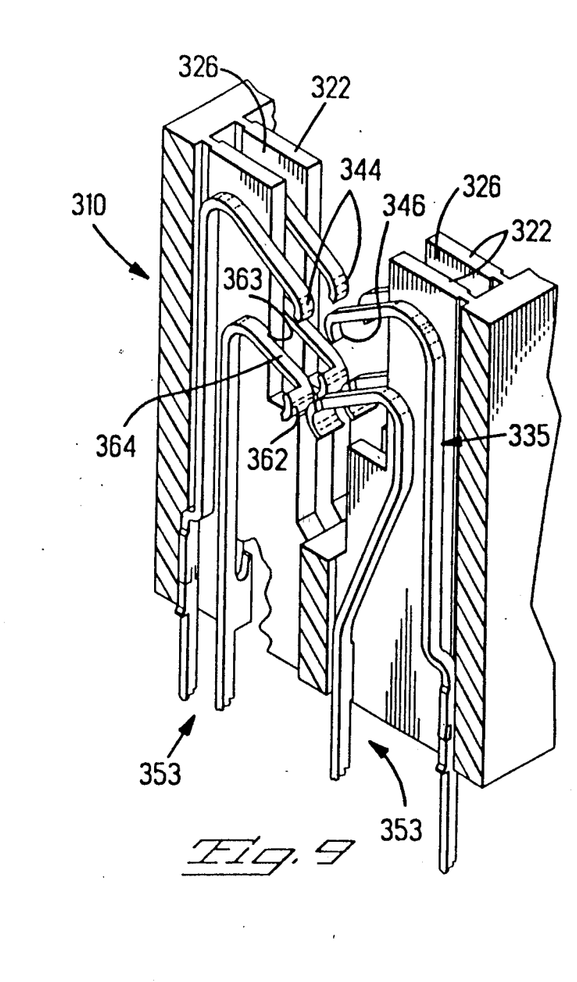
FIG. 9 is a side view of two of the ground contact members of FIG. 8 having the corresponding second contact sections of the terminal members extending along side each other for insertion into a common through-hole in the motherboard or backplane.

FIG. 9 illustrates another alternative embodiment 310 of the connector in which the signal and ground contact members 335,353 are both stamped and formed members having offset contact surfaces 344,362 and is also designed to be used with cards of the type shown in FIGS. 1 and 7. In the connector embodiment of FIG. 9, the contact surface 362 of ground contact member is formed on a "flag-shaped" portion that extends in a direction away from the associated signal contact member in the same cavity 326 such that the surface 362 will engage the ground contact 180 on a circuit card of the type shown in FIGS. 1 and 7 upon full insertion of the daughter card into the connector. Preferably surface 362 is dimpled or raised so that the ground contact surface 362 is assuredly offset horizontally from the associated signal contact surfaces 344. The signal contact 335, on the other hand, has no flag-shaped extension and will not engage the ground contact 180 as the card is inserted.

It is thought that the card edge connector of the present invention and many of its attendant advantages will be understood from the foregoing description. Changes may be made in the form, construction and arrangement of parts thereof without departing from the spirit and scope of the invention or sacrificing all of its material advantages.

We claim:

1. An electrical connector for use with a circuit card of the type having ground contact means disposed along a leading edge and proximate thereto and signal traces having signal contact means located rearwardly from said ground contact means on each major surface of the circuit card, said connector having a dielectric housing member with a mounting face and an opposed card receiving face, a card receiving cavity extending into said housing from said card receiving face to a card stop means, a plurality of contacts adapted for mating with said card at respective contact locations spaced laterally along said cavity and associated with trace locations along a circuit card received in said cavity, said plurality of contacts including signal contact members arranged in opposed pairs along opposite sides of said card receiving cavity at each said contact location and secured in respective contact receiving cavity, said signal contact members having first contact sections for engaging respective opposed signal traces on opposite major surfaces of said card upon card insertion therebetween, said first signal contact sections being defined on free ends of cantilevered beams extending into said cavity to be deflected outwardly by said card upon card insertion whereupon said first signal contact sections become engaged with respective contact sections of said signal traces upon full card insertion, said signal contact members having second contact sections at least exposed along the mounting face of the housing and adapted to be mated with corresponding signal contact means of another electrical article, and said connector further including a plurality of ground contact members, each said ground contact member being an essentially planar member and including a body section extending from first to second side edges and having a pair of opposed cantilevered beams extending upwardly from said body section proximate said first and second side edges, said housing being adapted to have a pair of said signal contact members secured therein at each said contact location, and a said ground contact member secured between and spaced from said pair of signal contact members in each contact receiving passageway, said cantilevered beams of said ground contact members extending upwardly into respective ones of said contact receiving passageways and into said card receiving cavity, said beams being deflectable in the plane of said ground contact members by said card upon insertion thereof into said card receiving cavity, said beams of said ground contact numbers including ground contact sections thereon engageable with respective said ground contact means of said card upon full card insertion; said connector further being characterized in that:

said ground contact sections on said beams are spaced both vertically and horizontally from the associated first signal contact sections; whereby said first signal contact sections will not engage ground means on a circuit card adapted to have a complementary staggered array of signal and ground contact surfaces when said card is received into said card receiving slot.

2. The electrical connector of claim 1 each wherein said cantilevered beam of said ground contact members includes a formed portion that extends outwardly of the plane of the body section, said formed portion defining a positioning means to assure said ground contact sections on said beams are spaced horizontally from associated ones of said signal contact sections in said contact receiving passageway.

3. The electrical connector of claim 1 wherein a first portion of each said first signal contact section has a thickness substantially equal to the thickness of the stock used to make the signal contact members and a second portion has a reduced thickness such that only the first portions engage the corresponding signal traces on said circuit card.

* * * * *

UNITED STATES PATENT OFFICE

CERTIFICATE OF CORRECTION

Patent No. 5,051,099        Dated   September 24, 1991

Inventor(s)  Charles S. Pickles et al.

It is certified that error(s) appear in the above-identified patent and that said Letters Patent is hereby corrected as shown below:

In the Claims:

Claim 1, column 8, line 41 - after the word "receiving", insert --passageways thereat in communication with said card receiving--.

Claim 1, column 9, line 4 - delete the word "numbers" and insert the word --members--.

Claim 2, column 10, line 1 - delete the word "each" after "1" and insert the word --each-- after "wherein".

Signed and Sealed this

Twenty-seventh Day of April, 1993

Attest:

MICHAEL K. KIRK

*Attesting Officer*     *Acting Commissioner of Patents and Trademarks*